(12) United States Patent
Ishii et al.

(10) Patent No.: US 6,434,727 B1
(45) Date of Patent: Aug. 13, 2002

(54) METHODS OF MAKING HARD MACRO CELL USING TIMING INTERVAL

(75) Inventors: Yuuji Ishii; Kunihiko Kawaguchi, both of Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/414,435

(22) Filed: Oct. 7, 1999

(30) Foreign Application Priority Data

Oct. 9, 1998 (JP) .......................................... 10-288314

(51) Int. Cl.[7] .............................................. G06F 17/50
(52) U.S. Cl. ....................................................... 716/6
(58) Field of Search ............................. 716/4, 6, 12, 17

(56) References Cited

U.S. PATENT DOCUMENTS 6,216,256 B1 * 4/2001 Inoue .............................. 716/6

* cited by examiner

Primary Examiner—Matthew Smith
Assistant Examiner—Thuan Do
(74) Attorney, Agent, or Firm—Arent Fox Kintner Plotkin & Kahn, PLLC (57) ABSTRACT

Input/output AC characteristics of a hard macro cell is specified in advance, delay cells 15 and 16 are provided in the input and output sides of the hard macro cell, and signal propagation delay times of the delay cells 15 and 16 are set so as to satisfy the specifications. These delay times are determined in such a way that no timing error occurs at the data inputs D of the D flip-flops 11 and 22 on condition that D flip-flops 20 and 22 are arranged outside the hard macro cell 10A, the data output end Q of the D flip-flop 20 is directly connected by a line to the data input end DI of the hard macro cell 10A, the data input end of the external synchronous flip-flop 22 is directly connected to the data output end DO of the hard macro cell 10A, and a clock CLK is commonly provided to the clock input ends CK of the hard macro cell 10A and the D flip-flops 20 and 22.

16 Claims, 8 Drawing Sheets

METHODS OF MAKING HARD MACRO CELL USING TIMING INTERVAL

BACKGROUND OF THE INVENTION

1. Field of the Invention

The present invention relates to a method of making a hard macro cell for use in a semiconductor chip design, a design method of a semiconductor chip with using the hard macro cell, and a storage medium having data expressing a configuration of the hard macro cell.

2. Description of the Related Art

A hard macro cell is a circuit module which has a desired function, an optimum configuration, and a fixed mask pattern. A hard macro cell is registered in a cell library stored in a storage device and used as a component, as it is, in a design stage of a semiconductor chip. A hard macro cell can be handled by a user in a similar manner to those in a cell library in which other cells are registered. Adopting a hard macro cell in design of a semiconductor chip, logic design, logic verification, circuit synthesizing and layout design can be simplified, whereby it is expected that design man-days can be greatly reduced.

Figure 7:
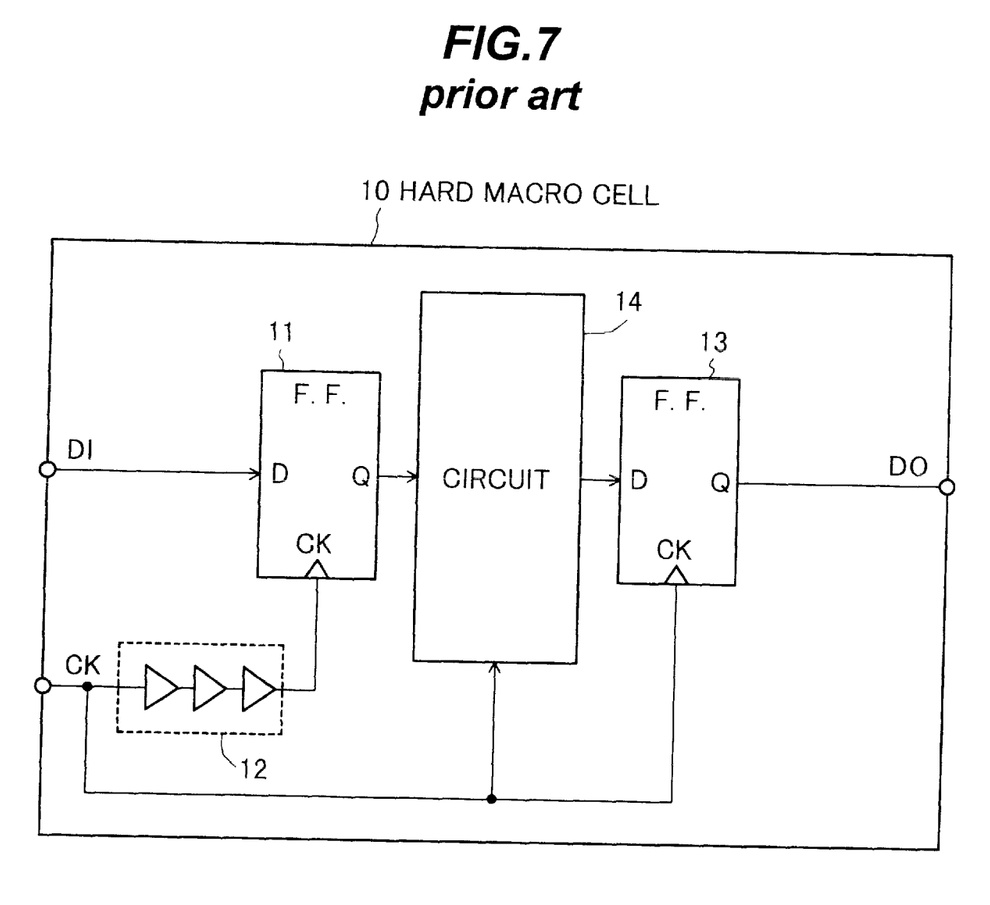
FIG. 7 is a schematic circuit diagram showing an concrete example of a prior art hard macro cell.

FIG. 7 is a schematic circuit diagram showing a concrete example of a prior art hard macro cell 10.

The data input end DI of the hard macro cell 10 is connected to the data input end D of a D flip-flop 11 and the clock input end CK of the hard macro cell 10 is connected to the clock input end CK of the D flip-flop 11 by way of a buffer gate 12. The data output end DO of the hard macro cell 10 is connected to the data output end Q of the D flip-flop 13 and the clock input end CK of the D flip-flop 13 is connected to the clock input end CK of the hard macro cell 10. A circuit 14 which works so as to perform the desired function of the hard macro cell 10 is connected between the D flip-flops 11 and 13. The circuit 14 runs in or out of synchronization with the clock CLK.

Figure 8:
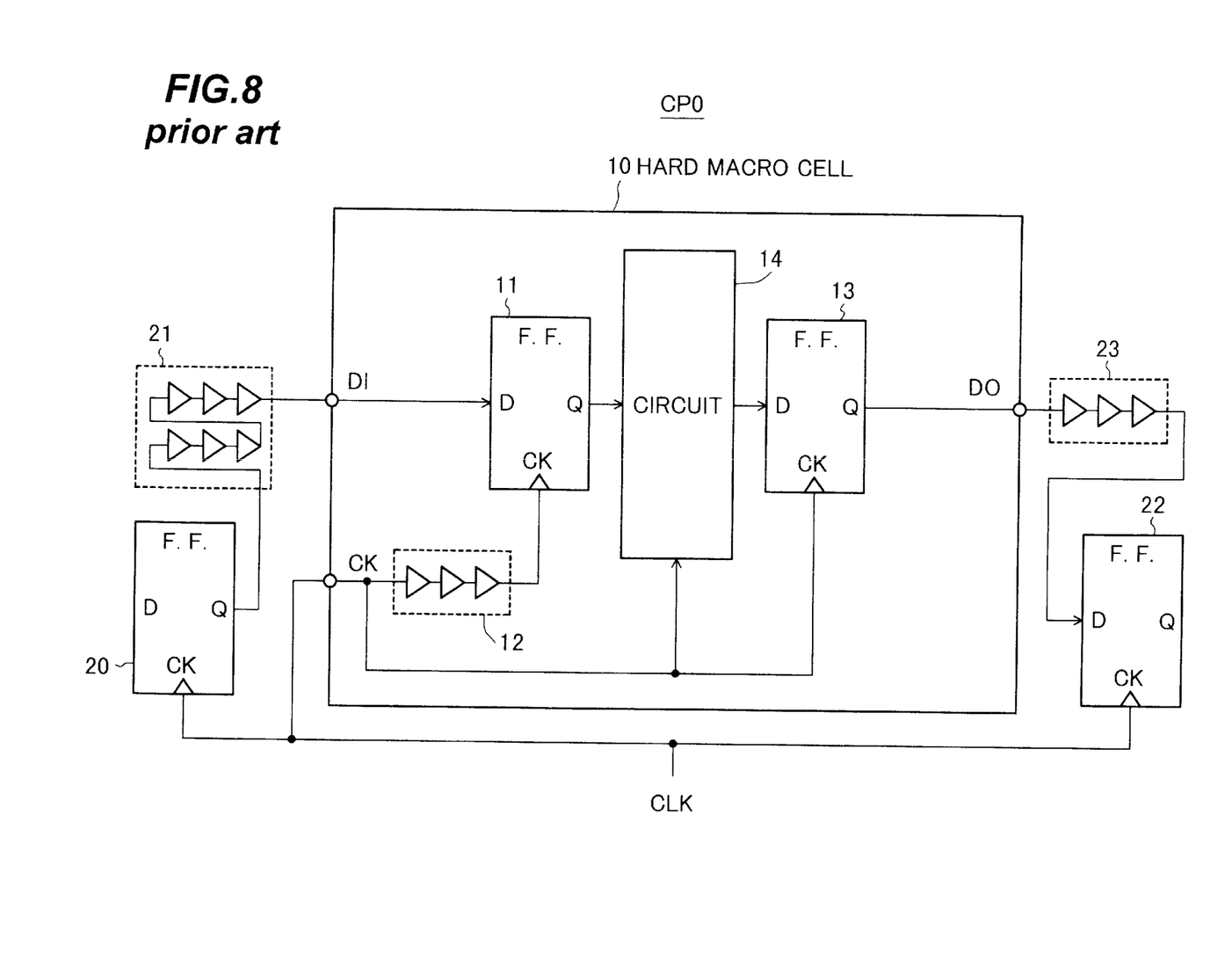
FIG. 8 is a diagram showing part of a circuit designed on a semiconductor chip using the hard macro cell of FIG. 7.

FIG. 8 is a diagram showing part of a circuit designed on a semiconductor chip CPO using the hard macro cell 10.

Timing adjustment has already been performed within the hard macro cell 10. However, what circuit or circuits are connected to the hard macro cell 10 is indefinite in a stage of making the hard macro cell 10. Therefore, timing adjustment is necessary between the hard macro cell 10 and other circuits when the hard macro cell 10 is adopted in a design of a semiconductor chirp.

In FIG. 8, in order to adjust timing, a delay cell 21 is connected between the data output end Q of a D flip-flop 20 and the data input end DI of the hard macro cell 10 and a delay cell 23 is connected between the data output end DO of the hard macro cell 10 and the data input end D of a D flip-flop 22. A clock CLK is commonly provided to the clock input ends CK of the hard macro cell 10 and the D flip-flops 20 and 22.

Since a prior art hard macro cell is not designed with clear specifications covering external AC characteristics, a possibility has been high that a timing error occurs in the vicinity of the input/output ends of the hard macro cell 10 in a timing margin check after a chip layout design of a semiconductor chip using such a hard macro cell 10. For this reason, in order to eliminate the timing error, a delay cell is inserted after layout design is finished or layout is performed again, thereby causing design time to be long.

SUMMARY OF THE INVENTION

Accordingly, it is an object of the present invention to provide a method of making a hard macro cell, a method of designing a semiconductor chip with using the same and a storage medium having data of the same, all of which make it possible to simplify design of a semiconductor chip with using the hard macro cell.

In the present invention, there is provided a method of making a hard macro cell, the hard macro cell having a data input end, a clock input end, and an internal synchronous flip-flop, the data input end of the hard macro cell being connected to a data input end of the internal synchronous flip-flop directly or by way of a combinational circuit, the method comprising the steps of: specifying an interval between an edge time point of a signal at the data input end of the hard macro cell and an active edge time point of a signal at the clock input end of the hard macro cell; and connecting a delay cell between the data input end of the hard macro cell and the data input end of the internal synchronous flip-flop so that no timing error occurs in the internal synchronous flip-flop if the specified interval is satisfied.

With the present invention, when a user performs semiconductor design using a hard macro cell or hard macro cells which are made by the method, a delay cell is not necessary to be inserted between the data input end of the hard macro cell and the external circuit, or it is possible to insert a delay cell having a predetermined delay time may, whereby an advantage of use of a hard macro cell to simplify a design is further increased to achieve a shorter design time.

Other aspects, objects, and the advantages of the present invention will become apparent from the following detailed description taken in connection with the accompanying drawings.

DESCRIPTION OF THE PREFERRED EMBODIMENTS

Referring now to the drawings, wherein like reference characters designate like or corresponding parts throughout several views, preferred embodiments of the present invention are described below.

It should be noted that the use of the terms "connected" indicates an electrical connection between two elements and can include an intervening element between the two "connected" elements.

Figure 1:
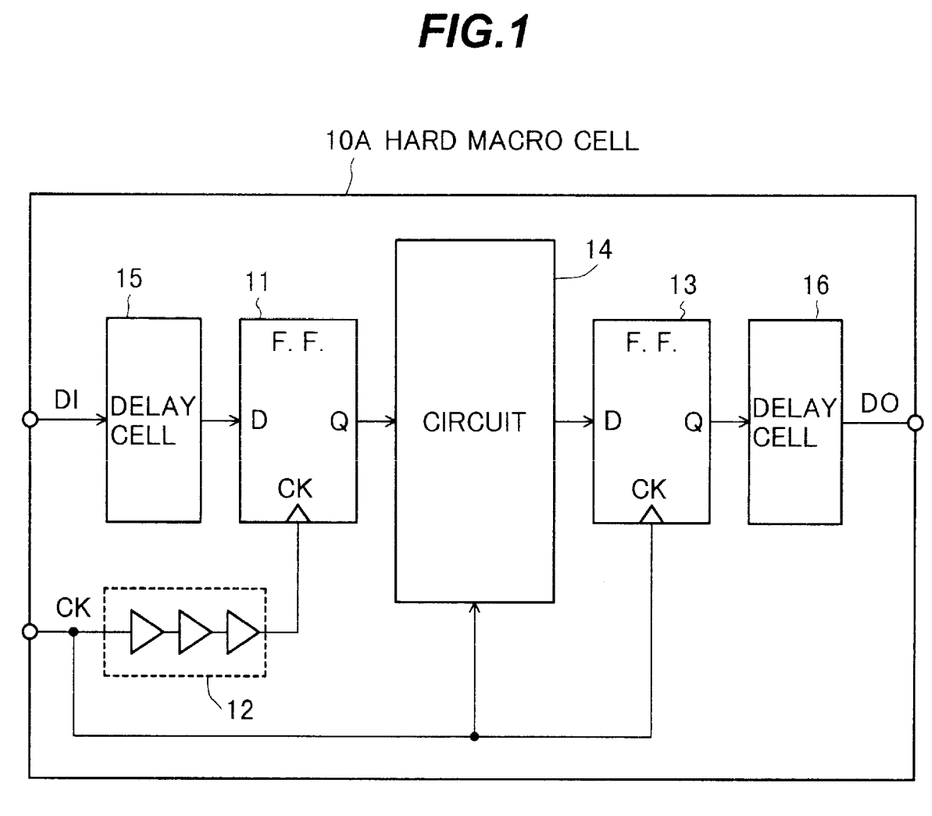
FIG. 1 is a circuit diagram showing a schematic configuration of a hard macro cell of a first embodiment in accordance with the present invention.

First Embodiment FIG. 1 is a circuit diagram showing a schematic configuration of a hard macro cell 10A. The same components as those of FIG. 7 are indicated by the same reference characters.

In the hard macro cell 10A, a delay cell 15 is connected between the data input end DI thereof and the data input end D of a D flip-flop 11 and a delay cell 16 is connected between the data output DO of the hard macro cell 10A and the data output end Q of a D flip-flop 13. The other configuration is the same as that of FIG. 7.

Input/outputs AC characteristics of the hard macro cell 10A are specified in advance. That is, the phases of signals at the data input end DI and output end DO relative to a clock at the clock input end CK of the hard macro cell 10A are specified in advance.

Figure 3A:
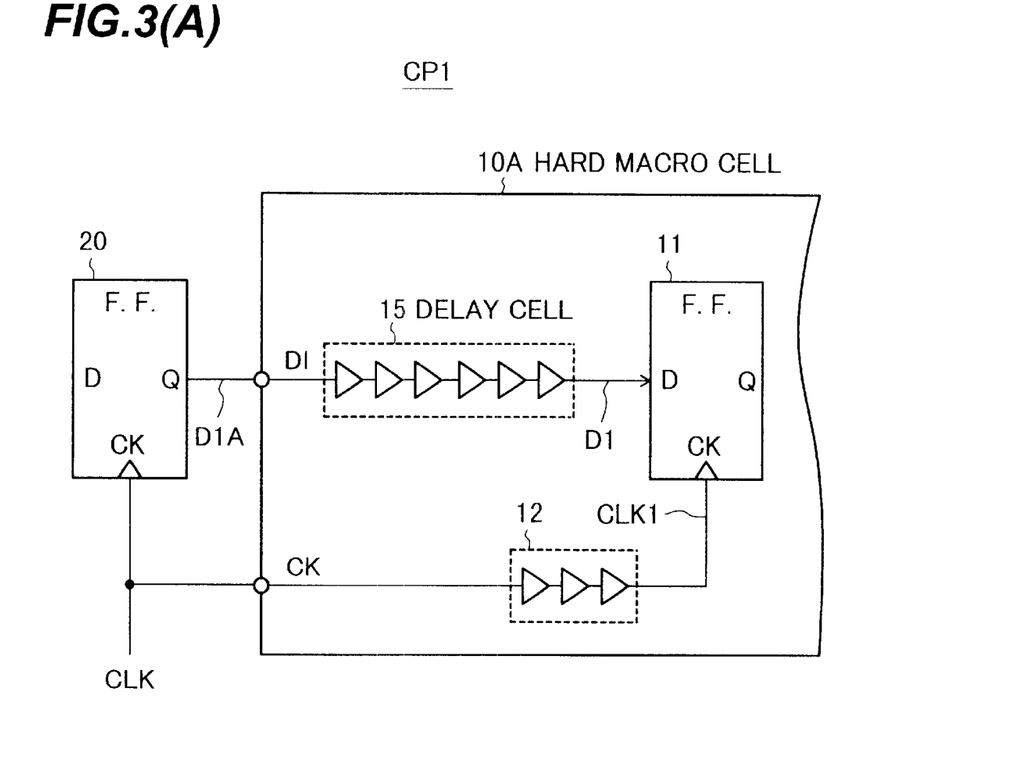
FIG. 3(A) is a diagram showing an example of the delay cell in the input side of FIG. 2 and circuits in the vicinity thereof.
Figure 3B:
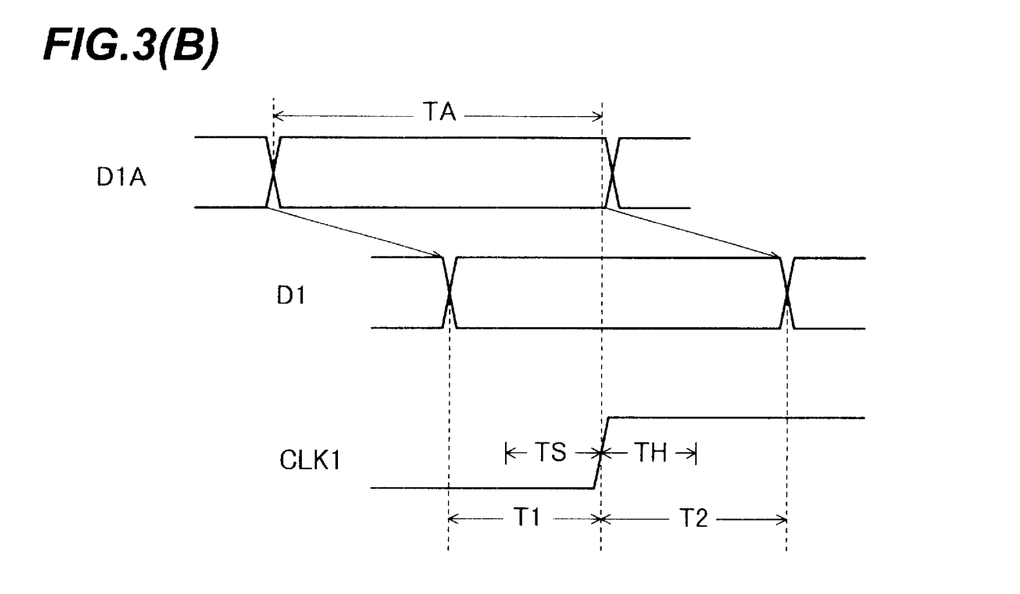
FIG. 3(B) is a timing chart of the circuit of FIG. 3(A)

To put it more concretely, the interval (TA in FIG. 3 (B)) between an edge time point of a signal at the data input end DI and an active edge time point (a rising edge time point in the embodiment) of a clock (CLK1) at the clock input end CK of the hard macro cell 10A is specified in advance. For example, the interval is specified as a prescribed small value compared with a clock cycle, being defined in a concrete manner, as 0. Likewise, the interval (TB in FIG. 4(B)) between an edge time point of a signal at the data output end DO and an active edge time point of a clock at the clock input end CK of the hard macro cell 10A is specified in advance. For example, the interval is specified as 3 ns in the case where a clock cycle is 10 ns.

The hard macro cell 10A is completed, after the circuit is provisionally laid out with internal AC characteristics being guaranteed, by inserting delay cells 15 and 16 in engineering change.

Figure 2:
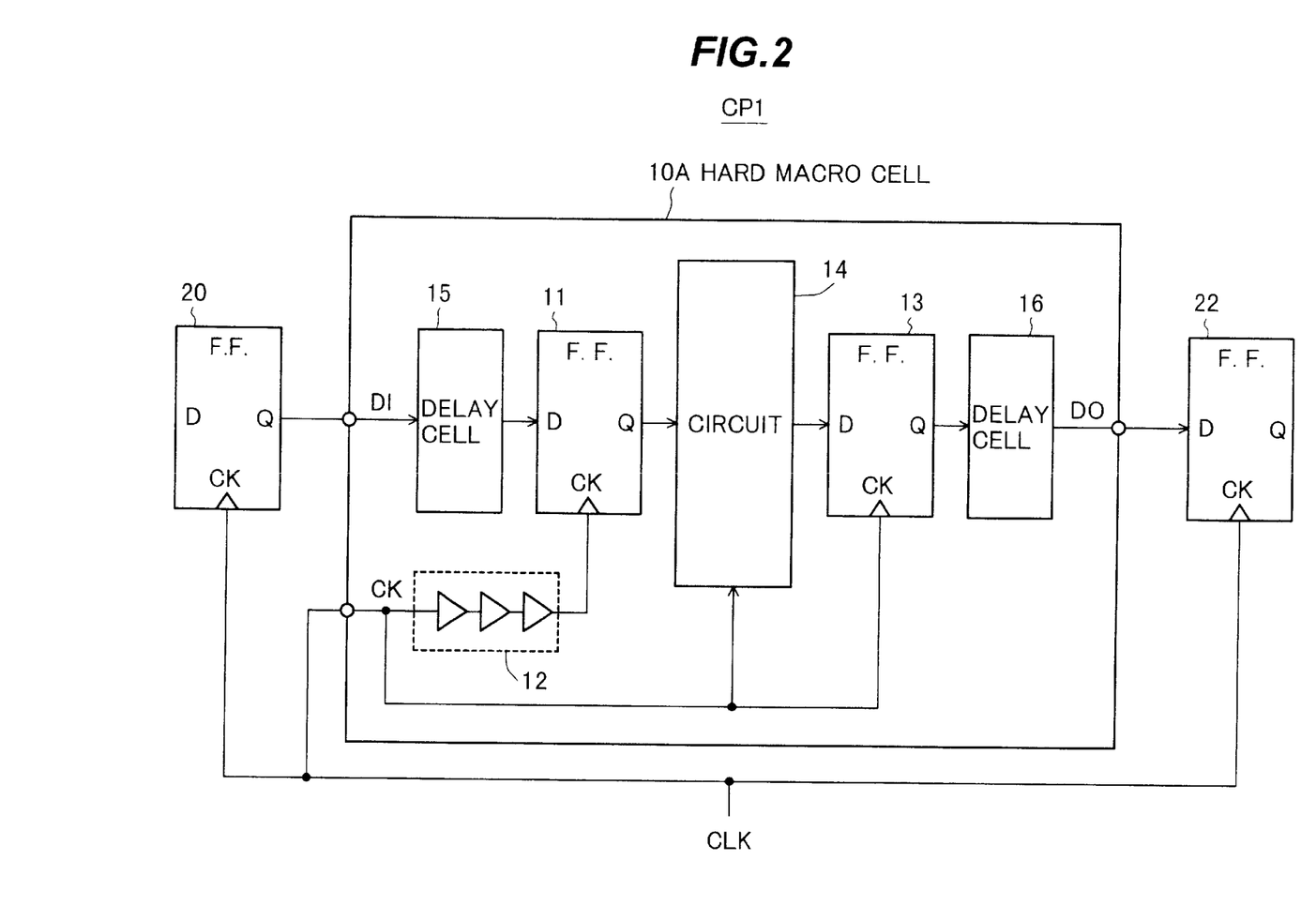
FIG. 2 is a schematic diagram showing the hard macro cell of FIG. 1 and circuits in the vicinity thereof arranged on a semiconductor chip.

FIG. 2 is a schematic diagram showing the hard macro cell 10A and circuits in the vicinity thereof arranged on a semiconductor chip CP1.

After the above-described specifications are met, the following conditions are needed to be satisfied. In other words, the above-described intervals are specified so that the following conditions are satisfied.

The delay time of the delay cell 15 is determined in such a way that no timing error occurs at the data input D of the D flip-flop 11 in the hard macro cell 10A on condition that a D flip-flop 20 is arranged outside the hard macro cell 10A, the data output end Q of the D flip-flop 20 is directly connected by a line to the data input end DI of the hard macro cell 10A and a clock CLK is commonly provided to the clock input ends CK of the hard macro cell 10A and the D flip-flop 20. That is, in such a way that no timing error occurs even if no delay cell is inserted between the data output end Q of the D flip-flop 20 and the data input end DI of the hard macro cell 10A by a user.

FIG. 3(A) shows an example of the delay cell 15 and circuits in the vicinity thereof. The delay time of the delay cell 15 is determined by delay characteristics of a delay buffer gate and the number of the cascaded delay buffer gates.

FIG. 3(B) shows timing of signals D1 and CLK1 respectively provided to the data input end D and the clock input end CK of the D flip-flop 11 and timing of a signal D1A at the data output end Q of the D flip-flop 20 when the delay cell 15 is connected in such a manner that conditions of a set up time TS: TS<T1 and a hold time TH: TH<T2 are satisfied. TS and TH are determined so that no timing error occurs with variations in process and temperature. (T1−TS) is a timing margin for a set up time, and (T2−TH) is a timing margin for a hold time. It is preferable that the smaller one of the two timing margin is as large as possible.

The ranges of values to satisfy the above described conditions are in advance specified with respect to resistance and parasitic capacitance of line between the data output end Q of the D flip-flop 20 and the data input end DI of the hard macro cell 10A, and taking this into consideration a user performs design.

Note that the above-mentioned time interval 0 is preferable on condition that signal propagation delay times of the D flip-flop 20 and the line between the data output end Q of the D flip-flop 20 and the data input end DI of the hard macro cell 10A are negligible.

Likewise, in FIG. 2, the delay time of the delay cell 16 is determined in such a way that no timing error occurs at the data input D of the D flip-flop 22 in the hard macro cell 10A on condition that a D flip-flop 22 is arranged outside the hard macro cell 10A, the data input end D of the D flip-flop 22 is directly connected by a line to the data output end DO of the hard macro cell 10A and a clock CLK is commonly provided to the clock input ends CK of the hard macro cell 10A and the D flip-flop 22. That is, in such a way that no timing error occurs even if no delay cell is inserted between the data output end DO of the hard macro cell 10A and the data input end D of the D flip-flop 22 by a user.

Figure 4A:
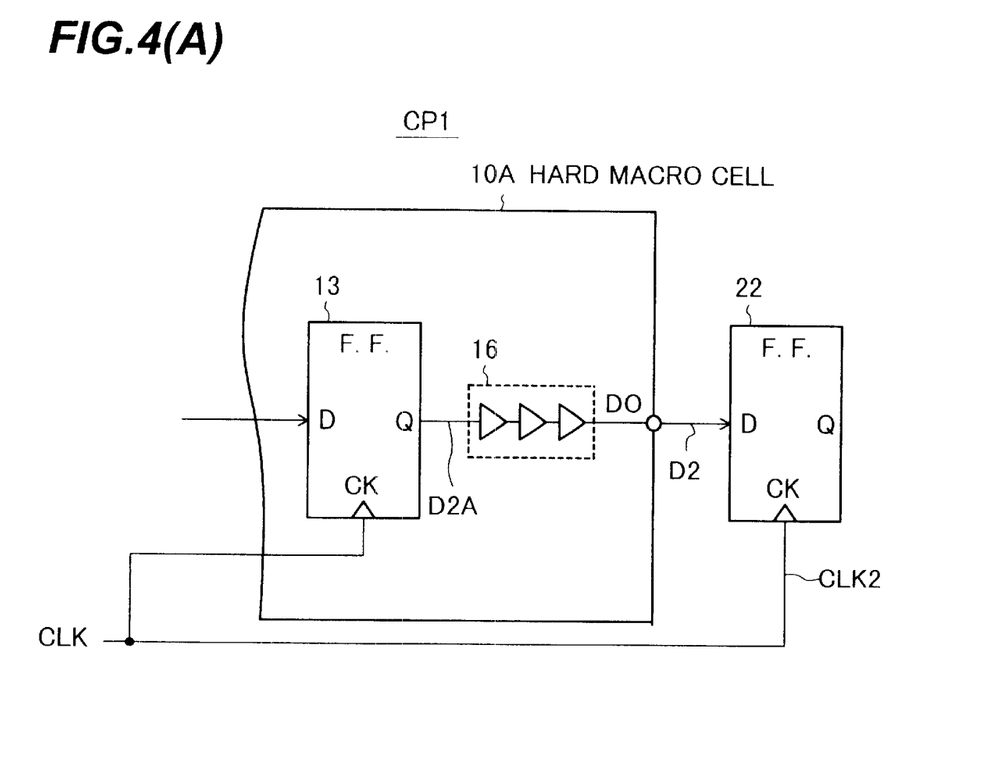
FIG. 4(A) is a diagram showing an example of the delay cell in the output side of FIG. 2 and circuits in the vicinity thereof.

FIG. 4(A) shows an example of the delay cell 16 and circuits in the vicinity thereof. The delay time of the delay cell 16 is determined by delay characteristics of a delay buffer gate and the number of the cascaded delay buffer gates.

Figure 4B:
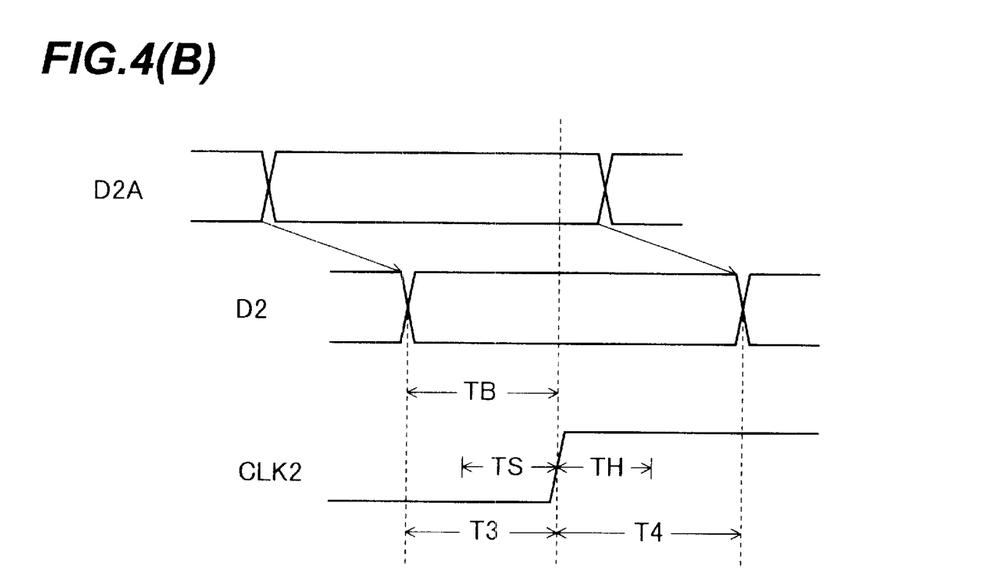
FIG. 4(B) is a timing chart of the circuit of FIG. 4(A)

FIG. 4(B) shows timing of signals D2 and CLK2 respectively provided to the data input end D and the clock input end CK of the D flip-flop 22 and timing of a signal D2A at the data output end Q of the D flip-flop 13 when the delay cell 16 is connected in such a manner that conditions of a set up time TS: TS<T3 and a hold time TH: TH<T4 are satisfied. TS and TH are determined so that no timing error occurs with variations in process and temperature. (T3−TS) is a timing margin for a set up time, and (T4−TH) is a timing margin for a hold time. It is preferable that the smaller one of the two timing margin is as large as possible.

The ranges of values to satisfy the above described conditions are in advance specified with respect to resistance and parasitic capacitance of line between the data input end D of the D flip-flop 22 and the data output end DO of the hard macro cell 10A, and taking this into consideration a user performs design.

Note that, with no consideration of the D flip-flop 22, in order that the above described condition on the D flip-flop 22 is satisfied, a set-up time of a signal at the data output end DO relative to a rising edge of a clock at the clock input end CK of the hard macro cell 10A may be selected at, for example, 3 ns when a clock cycle is 10 ns.

The hard macro cell 10A as described above is registered in the cell library and a user designs a semiconductor chip using the hard macro cell 10A, whereby an advantage of use of a hard macro cell that a design is simplified is further increased and as a result, a shorter design time can be achieved.

Second Embodiment

Figure 5:
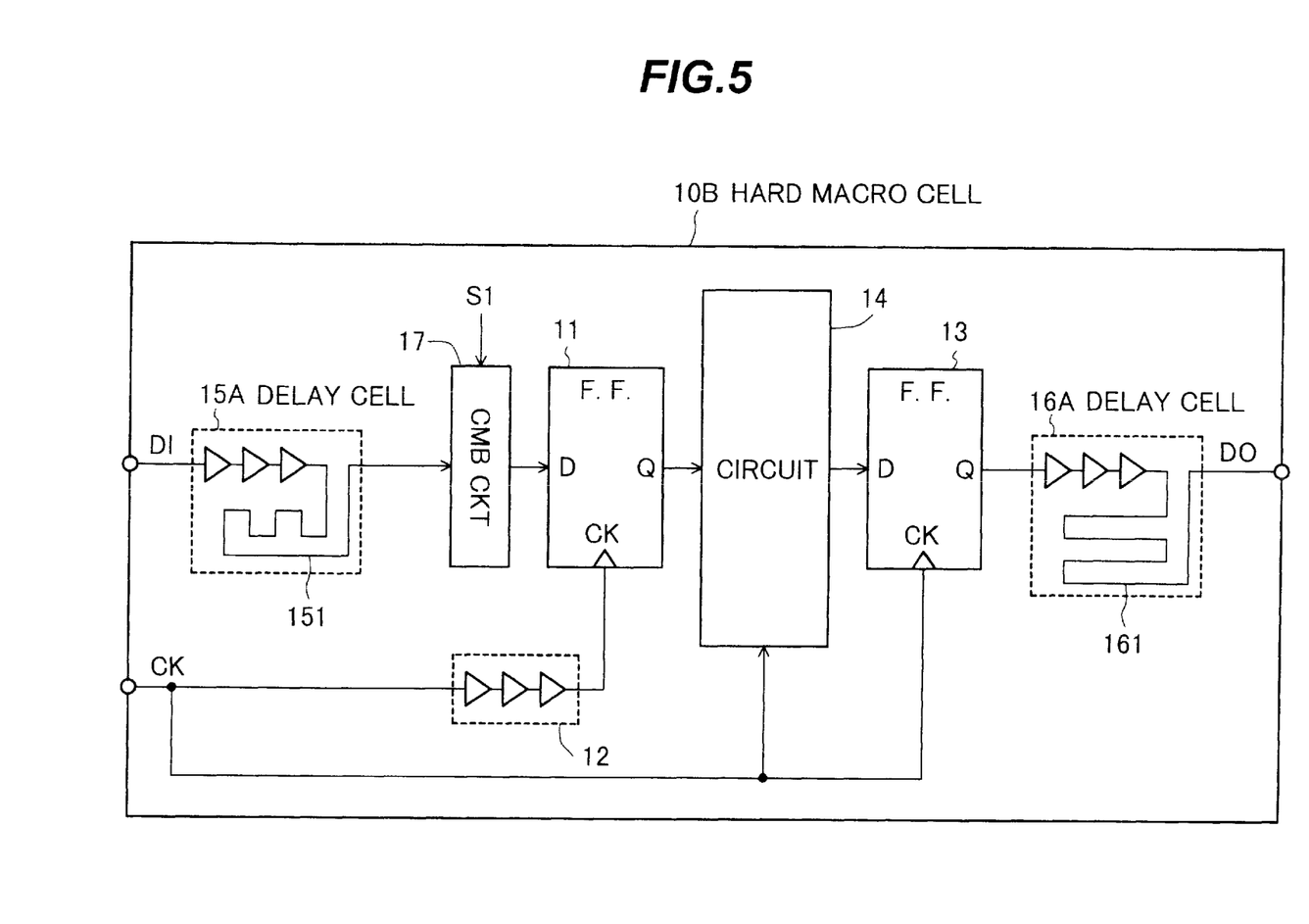
FIG. 5 is a circuit diagram showing a schematic configuration of a hard macro cell of a second embodiment in accordance with the present invention.

FIG. 5 is a circuit diagram showing a schematic configuration of a hard macro cell 10B of the second embodiment in accordance with the present invention.

In this circuit, a combinational circuit 17 is connected between the data input end DI of the hard macro cell 10B and the data input end D of the flip-flop 11. To the combinational circuit 17, for example, a fixed value S1, a signal SI from a circuit 14 or a signal S1 (for example, a mode signal) from outside the hard macro cell 10B is provided.

A delay cell 15A is further connected between the data input end DI of the hard macro cell 10B and the data input end D of the D flip-flop 11 in series with the combinational circuit 17, and the above described condition is satisfied on the D flip-flop 11 as shown in FIG. 3(B). The delay cell 15A is constructed of buffer gates and a line 151, and fine adjustment of a delay time of the delay cell 15A can be performed by changing a length of the line 151 so as to increase a timing margin in a stage of making the hard macro cell 10B.

Likewise, the delay cell 16A is constructed of buffer gates and a line 161 and fine adjustments of a delay time of the delay cell 16A can be performed by changing a length of the line 161 so as to increase a timing margin in a stage of making the hard macro cell 10B.

Third Embodiment

Figure 6:
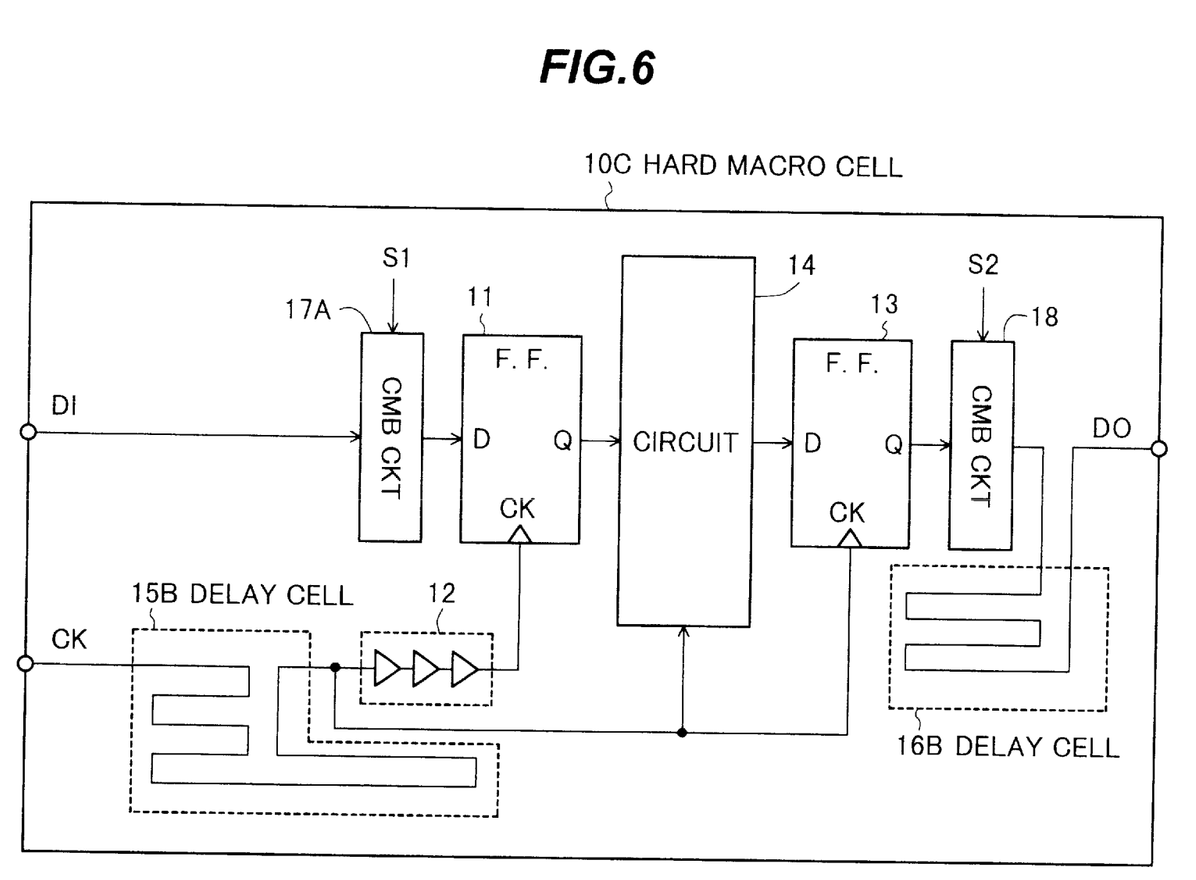
FIG. 6 is a circuit diagram showing a schematic configuration of a hard macro cell of a third embodiment in accordance with the present invention.

FIG. 6 is a circuit diagram showing a schematic configuration of a hard macro cell 10C of the third embodiment in accordance with the present invention.

In the hard macro cell 10C, a combinational circuit 17A is connected between the data input end DI of the hard macro cell 10C and the data input end D of the D flip-flop 11, and a combinational circuit 17 is connected between the data output end Q of the D flip-flop 13 and the data output end DO of the hard macro cell 10C. To the combinational circuit 18, for example, a fixed value S2, a signal S2 from the circuit 14 or a signal S2 (for example, a mode signal) from outside the hard macro cell 10C is provided.

Assume that a signal propagation delay time of the combinational circuit 17A is longer than the sum of signal propagation delay times of the delay cell 15A and the combinational circuit 17 of FIG. 5. In this case, a delay cell 15B is connected between the clock input end CK of the hard macro cell 10C and the buffer gate 12. The delay cell 15B is only constructed of a line, and the length of the line in the delay cell 15B is determined in a stage of making hard macro cell so that the above described condition is satisfied as in FIG. 3(B).

Likewise, the delay cell 16B which is connected between the combinational circuit 18 and the data output end DO of the hard macro cell 10C is only constructed of a line and the length of the line in the delay cell 16B is determined in a stage of making hard macro cell so that the above described condition is satisfied as in FIG. 4(B).

Although preferred embodiments of the present invention has been described, it is to be understood that the invention is not limited thereto and that various changes and modifications may be made without departing from the spirit and scope of the invention.

For example, any of the above described D flip-flops may be a synchronous flip-flop of other kind.

Further, in stead of the D flip-flop 11 or 13, a register constructed of a plurality of synchronous flip-flops may be employed. When a register is employed in stead of the D flip-flop 11, for example, in FIG. 2, the same delay cells as the delay cell 15 are connected to respective data input bits of the register. Like configuration applies when a register is employed in stead of the D flip-flop 13.

What is claimed is:

1. A method of making a hard macro cell, said hard macro cell having a data input end, a clock input end, and an internal synchronous flip-flop, said data input end of said hard macro cell being connected to a data input end of said internal synchronous flip-flop directly or by way of a combinational circuit, said method comprising the steps of:

specifying an interval between an edge time point of a signal at said data input end of said hard macro cell and an active edge time point of a signal at said clock input end of said hard macro cell; and connecting a delay cell between said data input end of said hard macro cell and said data input end of said internal synchronous flip-flop so that no timing error occurs in said internal synchronous flip-flop, if said specified interval is satisfied;

whereby said hard macro cell having said specified interval is made and it is ensured that no timing error occurs in said internal synchronous flip-flop, if said specified interval is satisfied.

2. A method of making a hard macro cell according to claim 1, wherein said specifying step is performed in such a way that said interval is determined so that no timing error occurs in said internal synchronous flip-flop on condition that an external synchronous flip-flop having a clock input end is arranged outside said hard macro cell, a data output end of said external synchronous flip-flop is directly connected to said data input end of said hard macro cell, and a clock is commonly provided to said clock input ends of said hard macro cell and said external synchronous flip-flop.

3. A method of making a hard macro cell according to claim 2, wherein said delay cell comprises a delay buffer gate to adjust said interval.

4. A method of making a hard macro cell according to claim 2, wherein said delay cell comprises a line whose length is determined to adjust said interval.

5. A method of making a hard macro cell, said hard macro cell having a data input end, a clock input end, and an internal synchronous flip-flop, said data input end of said hard macro cell being connected to a data input end of said internal synchronous flip-flop directly or by way of a combinational circuit, said method comprising the steps of:

specifying an interval between an edge time point of a signal at said data input end of said hard macro cell and an active edge time point of a signal at said clock input end of said hard macro cell; and connecting a delay cell between said clock input end of said hard macro cell and a clock input end of said internal synchronous flip-flop so that no timing error occurs in said internal synchronous flip-flop, if said specified interval is satisfied;

whereby said hard macro cell having said specified interval is made and it is ensured that no timing error occurs in said internal synchronous flip-flop, if said specified interval is satisfied.

6. A method of making a hard macro cell according to claim 5, wherein said specifying step is performed in such a way that said interval is determined so that no timing error occurs in said internal synchronous flip-flop on condition that an external synchronous flip-flop having a clock input end is arranged outside said hard macro cell, a data output end of said external synchronous flip-flop is directly connected to said data input end of said hard macro cell, and a clock is commonly provided to said clock input ends of said hard macro cell and said external synchronous flip-flop.

7. A method of making a hard macro cell, said hard macro cell having a data output end, a clock input end, and an internal synchronous flip-flop, said data output end of said hard macro cell being connected to a data output end of said internal synchronous flip-flop directly or by way of a combinational circuit, said method comprising the steps of:

specifying an interval between an edge time point of a signal at said data output end of said hard macro cell and an active edge time point of a signal at said clock input end of said hard macro cell; and connecting a delay cell between said data output end of said hard macro cell and said data output end of said internal synchronous flip-flop so that no timing error occurs in said internal synchronous flip-flop, if said specified interval is satisfied;

whereby said hard macro cell having said specified interval is made and it is ensured that no timing error occurs in said internal synchronous flip-flop, if said specified interval is satisfied.

8. A method of making a hard macro cell according to claim 7, wherein said specifying step is performed in such a way that said interval is determined so that no timing error occurs in said internal synchronous flip-flop on condition that an external synchronous flip-flop having a clock input end is arranged outside said hard macro cell, a data input end of said external synchronous flip-flop is directly connected to said data output end of said hard macro cell, and a clock is commonly provided to said clock input ends of said hard macro cell and said external synchronous flip-flop.

9. A method of making a hard macro cell, said hard macro cell having a data input end, a data output end, a clock input end, and first and second internal synchronous flip-flops, said data input end of said hard macro cell being connected to a data input end of said first internal synchronous flip-flop directly or by way of a combinational circuit, said data output end of said hard macro cell being connected to a data output end of said second internal synchronous flip-flop directly or by way of a combinational circuit, said method comprising the steps of:

specifying a first interval between an edge time point of a signal at said data input end of said hard macro cell and an active edge time point of a signal at said clock input end of said hard macro cell;

connecting a first delay cell between said data input end of said hard macro cell and said data input end of said first internal synchronous flip-flop so that no timing error occurs in said first internal synchronous flip-flop, if said first specified interval is satisfied;

specifying a second interval between an edge time point of a signal at said data output end of said hard macro cell and said active edge time point of said signal at said clock input end of said hard macro cell; and connecting a second delay cell between said data output end of said second internal synchronous flip-flop and said data output end of said hard macro cell so that no timing error occurs in said second internal synchronous flip-flop, if said second specified interval is satisfied;

whereby said hard macro cell having said first and second specified intervals is made and it is ensured that no timing error occurs in said first and second internal synchronous flip-flops, if said first and second specified intervals are satisfied.

10. A method of making a hard macro cell according to claim 9, wherein said specifying steps are performed in such a way that said first and second interval are determined so that no timing error occurs in said first and second internal synchronous flip-flops on condition that first and second external synchronous flip-flops each having a clock input end are arranged outside said hard macro cell, a data output end of said first external synchronous flip-flop is directly connected to said data input end of said hard macro cell, a data input end of said second external synchronous flip-flop is directly connected to said data output end of said hard macro cell, and a clock is commonly provided to said clock input ends of said hard macro cell and said first and second external synchronous flip-flops.

11. A method of making a hard macro cell, said hard macro cell having a data input end, a data output end, a clock input end, and first and second internal synchronous flip-flops, said data input end of said hard macro cell being connected to a data input end of said first internal synchronous flip-flop directly or by way of a combinational circuit, said data output end of said hard macro cell being connected to a data output end of said second internal synchronous flip-flop directly or by way of a combinational circuit, said method comprising the steps of:

specifying a first interval between an edge time point of a signal at said data input end of said hard macro cell and an active edge time point of a signal at said clock input end of said hard macro cell;

connecting a first delay cell between said clock input end of said hard macro cell and a clock input end of said first internal synchronous flip-flop so that no timing error occurs in said first internal synchronous flip-flop, if said first specified interval is satisfied;

specifying a second interval between an edge time point of a signal at said data output end of said hard macro cell and said active edge time point of said signal at said clock input end of said hard macro cell; and connecting a second delay cell between said data output end of said second internal synchronous flip-flop and said data output end of said hard macro cell so that no timing error occurs in said second internal synchronous flip-flop, if said second specified interval is satisfied;

whereby said hard macro cell having said first and second specified intervals is made and it is ensured that no timing error occurs in said first and second internal synchronous flip ops, if said first and second specified intervals are satisfied.

12. A method of making a hard macro cell according to claim 11, wherein said specifying steps are performed in such a way that said first and second interval are determined so that no timing error occurs in said first and second internal synchronous flip-flops on condition that first and second external synchronous flip-flops each having a clock input end are arranged outside said hard macro cell, a data output end of said first external synchronous flip-flop is directly connected to said data input end of said hard macro cell, a data input end of said second external synchronous flip-flop is directly connected to said data output end of said hard macro cell, and a clock is commonly provided to said clock input ends of said hard macro cell and said first and second external synchronous flip-flops.

13. A method of designing a circuit formed on a semiconductor chip using a hard macro cell, said hard macro cell having a data input end, a clock input end, and an internal synchronous flip-flop, said data input end of said hard macro cell being connected to a data input end of said internal synchronous flip-flop directly or by way of a combinational circuit, said method comprising the steps of, in making said hard macro cell:

specifying an interval between an edge time point of a signal at said data input end of said hard macro cell and an active edge time point of a signal at said clock input end of said hard macro cell; and connecting a delay cell between said data input end of said hard macro cell and said data input end of said internal synchronous flip-flop so that no timing error occurs in said internal synchronous flip-flop, if said specified interval is satisfied;

whereby said hard macro cell having said specified interval is made and it is ensured that no timing error occurs in said internal synchronous flip-flop, if said specified interval is satisfied.

14. A method of designing a circuit formed on a semiconductor chip using a hard macro cell, said hard macro cell having a data output end, a clock input end, and an internal synchronous flip-flop, said data output end of said hard macro cell being connected to a data output end of said internal synchronous flip-flop directly or by way of a combinational circuit, said method comprising the steps of, in making said hard macro cell:

specifying an interval between an edge time point of a signal at said data output end of said hard macro cell and an active edge time point of a signal at said clock input end of said hard macro cell; and connecting a delay cell between said data output end of said hard macro cell and said data output end of said internal synchronous flip-flop so that no timing error occurs in said internal synchronous flip-flop, if said specified interval is satisfied;

whereby said hard macro cell having said specified interval is made and it is ensured that no timing error occurs in said internal synchronous flip-flop, if said specified interval is satisfied.

15. A computer readable medium, having thereon data expressing configuration of a hard macro cell, said data being loaded for designing a circuit formed on a semiconductor chip, said hard macro cell being configured by comprising a data input end, a clock input end, and an internal synchronous flip-flop, said data input end of said hard macro cell being connected to a data input end of said internal synchronous flip-flop directly or by way of a combinational circuit, said hard macro cell further comprising a delay cell connected between said data input end of said hard macro cell and said data input end of said internal synchronous flip-flop so that no timing error occurs in said internal synchronous flip-flop, if a specified interval is satisfied, and wherein said interval is one between an edge time point of a signal at said data input end of said hard macro cell and an active edge time point of a signal at said clock input end of said hard macro cell;

whereby it is ensured that no timing error occurs in said internal synchronous flip-flop, if said specified interval is satisfied.

16. A computer readable medium, having thereon data expressing configuration of a hard macro cell, said data being loaded for designing a circuit formed on a semiconductor chip, said hard macro cell being configured by comprising a data output end, a clock input end, and an internal synchronous flip-flop, said data output end of said hard macro cell being connected to a data output end of said internal synchronous flip-flop directly or by way of a combinational circuit, said hard macro cell further comprising a delay cell connected between said data output end of said hard macro cell and said data output end of said internal synchronous flip-flop so that no timing error occurs in said internal synchronous flip-flop, if a specified interval is satisfied, and wherein said interval is one between an edge time point of a signal at said data output end of said hard macro cell and an active edge time point of a signal at said clock input end of said hard macro cell;

whereby it is ensured that no timing error occurs in said internal synchronous flip-flop, if said specified interval is satisfied.

* * * * *

UNITED STATES PATENT AND TRADEMARK OFFICE
CERTIFICATE OF CORRECTION

PATENT NO.      : 6,434,727 B1
DATED           : August 13, 2002
INVENTOR(S)     : Ishii et al.

It is certified that error appears in the above-identified patent and that said Letters Patent is hereby corrected as shown below:

<u>Title page,</u>
Item [73], please change the address of the Assignee from "Kanagawa"
to -- Kawasaki --.

Signed and Sealed this

Eleventh Day of February, 2003

JAMES E. ROGAN
*Director of the United States Patent and Trademark Office*